United States Patent [19]
Fuller

[11] Patent Number: 4,623,206
[45] Date of Patent: Nov. 18, 1986

[54] SPRING BATTERY RETAINER

[76] Inventor: James T. Fuller, 235 N. Malina Ave., Orange, Calif. 92669

[21] Appl. No.: 687,528

[22] Filed: Dec. 28, 1984

[51] Int. Cl.$^4$ .................. H01R 9/09; A47B 97/00
[52] U.S. Cl. .................. 339/17 C; 248/505
[58] Field of Search .......... 339/17 R, 17 C, 17 N; 248/500, 505, 509, 510; 361/400, 403, 417; 429/96–100

[56] References Cited

U.S. PATENT DOCUMENTS

| | | | |
|---|---|---|---|
| 2,374,375 | 4/1945 | O'Donnell | 240/6.4 |
| 2,854,563 | 9/1958 | Catching | 240/6.4 |
| 3,207,954 | 9/1965 | Elliott | 361/400 |
| 3,333,810 | 8/1967 | Schlapman | 248/505 |
| 3,383,503 | 5/1968 | Montgomery | 240/59 |
| 3,384,740 | 5/1968 | Wood | 240/6.4 |
| 3,508,041 | 4/1970 | Sweany et al. | 240/6.4 |
| 3,521,049 | 7/1970 | Young | 240/6.4 |
| 3,549,878 | 12/1970 | Bailey | 240/6.4 |
| 3,624,384 | 11/1971 | Ledingham | 240/6.4 |
| 3,737,647 | 6/1973 | Gomi | 240/6.4 |
| 3,758,771 | 9/1973 | Frohardt et al. | 240/6.4 |
| 3,790,720 | 2/1974 | Schartmann | 179/84 VF |
| 3,805,047 | 4/1974 | Dockstader | 240/6.4 |
| 3,814,926 | 6/1974 | Frasca | 240/6.4 |
| 3,818,209 | 6/1974 | Roth | 240/6.4 |
| 3,866,035 | 2/1975 | Richey, Jr. | 240/6.4 |
| 3,901,121 | 8/1975 | Kleiner | 84/484 |
| 3,916,253 | 10/1975 | Driscoll | 315/211 |
| 3,984,674 | 10/1976 | Guetta | 240/6.4 |
| 3,986,144 | 10/1976 | Russo | 331/111 |
| 4,161,018 | 7/1979 | Briggs et al. | 362/104 |
| 4,206,897 | 6/1980 | Smith et al. | 248/505 |
| 4,254,451 | 3/1981 | Cochran, Jr. | 362/103 |

FOREIGN PATENT DOCUMENTS 2539379 3/1977 Fed. Rep. of Germany ...... 361/403

Primary Examiner—Neil Abrams
Attorney, Agent, or Firm—Lyon & Lyon

[57] ABSTRACT

There is disclosed herein a spring battery retainer that is used to secure a small "coin" or "button" battery to a printed circuit (PC) card or the like. Use of the spring battery retainer provides for positive location of the battery, inexpensive electrical contacts for the battery terminals and positive spring compression that is necessary to insure hard contact with the cathode and the anode terminals of the battery. The battery is easily installed and removed by slightly lifting one end of the battery retainer and sliding the battery in or out. A bend in the spring battery retainer provides sufficient hold-down pressure so that the battery makes reliable contact with an electrical pad located on a PC board. The spring battery retainer is inserted into the PC card and then soldered to it in much the same way as a standard electrical component such as a resistor. The dimensions of the spring battery retainer can be varied so that coin or button batteries of various sizes can be securely fastened to a PC card.

8 Claims, 5 Drawing Figures

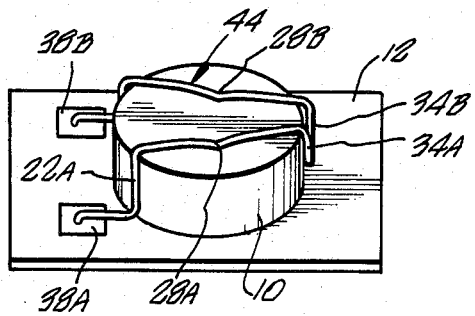
FIG_1.
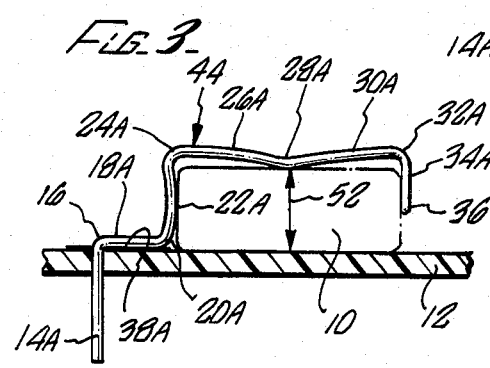
FIG_3.
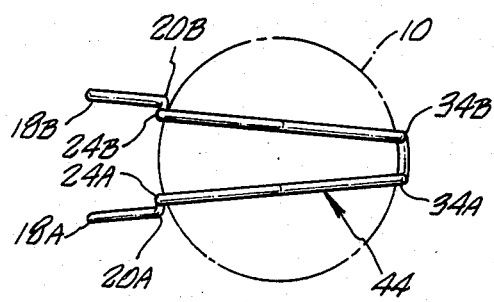
FIG_4.
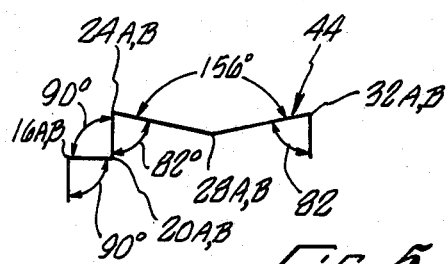
FIG_5.
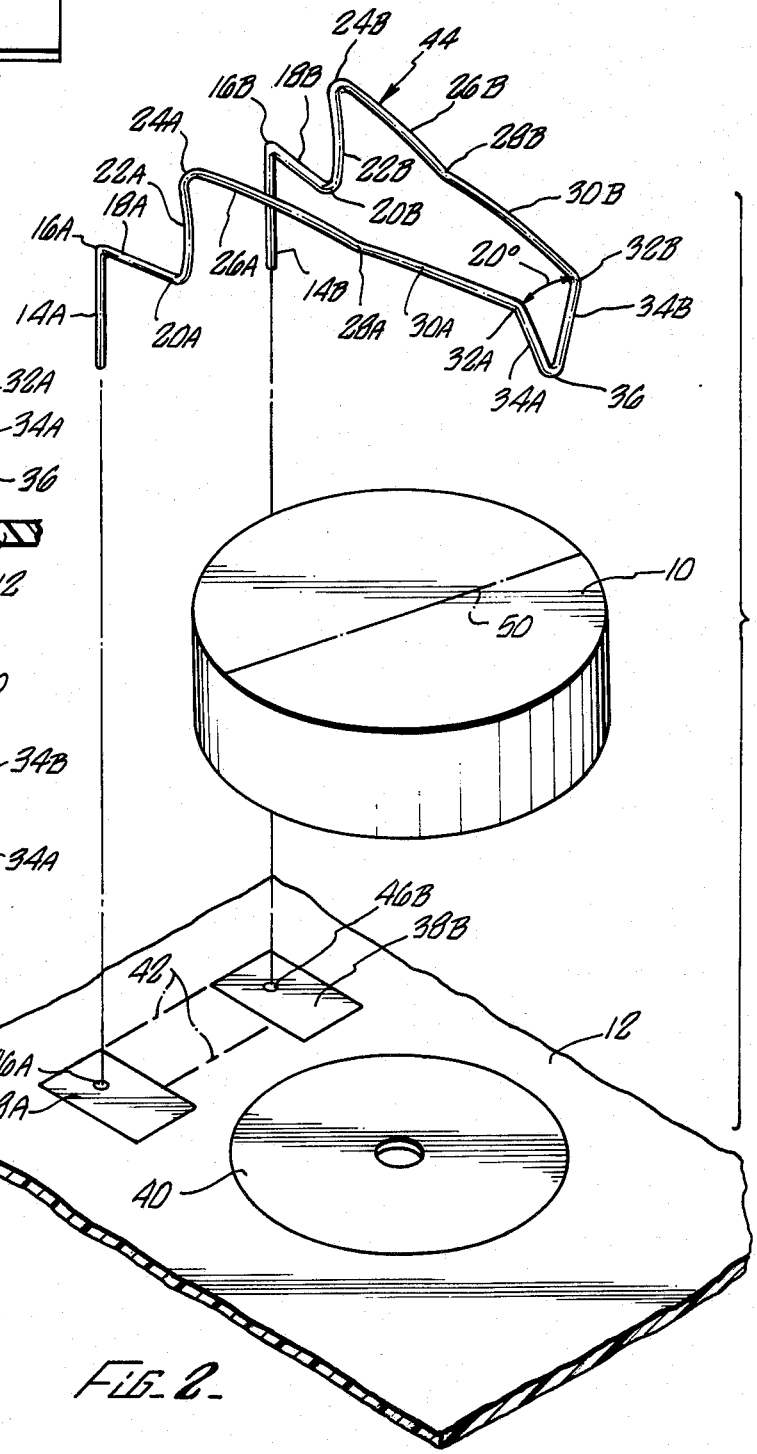
FIG_2.

SPRING BATTERY RETAINER

BACKGROUND OF THE INVENTION

The present invention relates to an inexpensive battery retainer that secures a coin or button battery to a PC card in a manner that provides reliable mechanical and electrical contact. Miniature electronic devices, such as electronic jewelry, shown in U.S. Pat. No. 3,508,041 dislose small electronic devices wherein it is necessary to secure to such a device a small power source such as a lithium battery. Lithium button batteries are also attached to multi-function computer cards in order to support the "clock-calendar" function. Such a battery, when connected to a PC card, must be firmly held in place and must also make reliable electrical connection to the electrical circuit. Many of the batteries used in such devices are coin or button type batteries with stainless steel cases. Soldering electrical terminals to a stainless steel case can be expensive and hazardous in that damage may be done to the battery when the battery is etched or heated. Spot welding battery terminals to coin batteries is also commonly used. However, spot welding can also be expensive. Once a terminal is spot welded to the battery then another connection is usually soldered to the battery terminal before the battery is connected to the electrical circuit. Other methods of securing coin or button batteries to PC cards involve the use of battery holders. These holders are bulky, take up needed space, are difficult to manufacture and are therefore relatively expensive.

It has been the objective of workers in this field to provide a low profile device that occupies a small amount of space and is inexpensive for connecting a coin or button battery to a PC card so that secure mechanical and electrical connections are made between the coin battery and the PC card.

SUMMARY OF THE INVENTION

According to the present invention and exemplary embodiment thereof described herein, an improved battery retainer is provided. In preferred form, the spring battery retainer is fabricated from grade A drawn wire, which is electrically conductive, and which meets or exceeds printed circuit card manufacturer's design specifications for "hold down" force and tempered-in memory. The battery retainer is symmetrical and has approximately five elastic bends in each leg. Two leads of the spring battery retainer are inserted in a PC card and then soldered flush to pads on the PC card. When soldered in place, the tip of the spring battery retainer can be lifted slightly and a coin battery can be inserted underneath. Electrical contact to the anode of the battery is made by the spring battery retainer and electrical contact with the cathode of the battery is made by contact between the cathode of the battery and a plated area on the PC card. Positive spring compression applied by the spring battery retainer to the anode of the battery securely holds the battery to the PC card and also provides the necessary "hold-down" pressure so that there is reliable electrical contact between the cathode of the battery and the PC card. The battery retainer contacts the anode of the battery in six places, in a symmetrical fashion, which provides triangular support and which prevents lateral movement of the battery.

Accordingly, it is an object of the present invention to provide an improved battery retainer for securing a coin or button type battery to a PC card.

Another object of this invention is to provide a battery retainer that is easily designed into a PC card, that is low in profile, economical on space, inexpensive, light in weight and which offers flexibility in mounting location.

Another object of the present invention is to provide a battery retainer that is easily and reliably inserted into a single sided or multi-layered PC card with plated through holes.

BRIEF DESCRIPTION OF THE DRAWINGS

The objects and features of the present invention will become better understood after the following description taken in conjunction with the drawings in which:

FIG. 1 shows a perspective view of a spring battery retainer, a coin battery and a PC card wherein the coin battery and spring battery retainer are installed on a PC card, FIG. 2 shows an exploded view of the spring battery retainer, the coin battery and the PC card, FIG. 3 shows a side view of the spring battery retainer, the coin battery and the PC card, FIG. 4 shows a top view of the spring battery retainer and the coin battery, and FIG. 5 shows a side view of the spring battery retainer with the angles of various bends shown.

DESCRIPTION OF THE PREFERRED EMBODIMENT

Turning now to FIGS. 1 and 2, FIG. 1 shows a battery 10 mounted to a PC card 12 and held in place by a spring battery retainer 44. The spring battery retainer 44 is mounted to the PC card 12 on pads 38a and 38b. The spring battery retainer 44 connects to the battery 10 at a support leg 22a and a support leg 22b (not shown), bends 28a and 28b and at flanges 34a and 34b. This provides for six point mechanical connection between the battery 10 and the spring battery retainer 44. This triangular method of securing the battery 10 to the PC card 12 prevents lateral movement of the battery 10.

FIG. 2 shows an exploded view of the spring battery retainer 44, the battery 10 and the PC card 12. The spring battery retainer 44 is mounted to the PC card 12 through holes 46a and 46b. Base sections 18a and 18b mount flush against the PC card 12 at base pads 38a and 38b. The base pads 38a and 38b are typical PC card pads which provide an area for soldering the base sections 18a and 18b of the spring battery retainer 44 to PC card 12. A cathode pad 40 is a typical PC card electrical pad which provides for electrical connection between the cathode of the battery 10 and the PC card pad 40. The spring battery retainer 44 is electrically conductive and connects to the anode of the battery 10 at contact sections 22a, 22b, 28a, 28b, 34a and 34b. As shown, pads 38a and 38b can be separate pads or they can be connected as shown by dotted lines 42 and as required by particular PC card layout requirements. Spring battery retainer 44 is typically fabricated from grade A wire with a diameter of 0.0285" and which is made of drawn-wire metal alloys such as as phosphor bronze or beryllium copper. The drawn wire material typically has as temper specification of QQW-321d or QQC-530. As shown, spring battery clip 44 is symmetrical with respect to tip bend 36. In the preferred embodiment, leads 14a and 14b are inserted into the holes 46a and 46b of PC card 12. Base sections 18a and 18b are then soldered to pads 38a and 38b which makes an electrical and mechanical connection between spring battery retainer 44 and PC card 12. By slightly lifting tip bend 36, battery 10 can be inserted underneath spring battery retainer 44 and between flanges 34a and 34b and support legs 22a and 22b. This mounting arrangement provides for easy insertion and removal of the battery 10 from PC card 12. Spring battery retainer 44 exerts a compressive pressure on battery 10 at compressive point bends 28a and 28b approximately along cross section line 50 of the battery 10. This provides for substantially uniform "hold down" pressure on the battery 10.

Leads 14a and 14b are mounted to PC card 12 through the holes 46a and 46b. Bends 16a and 16b are substantially ninety degree bends which allows base sections 18a and 18b to be parallel to the surface plane of the pads 38a and 38b. Leads 14a and 14b, bends 16a and 16b and base sections 18a and 18b form a base support means which serves as a means of positioning spring battery retainer 44 and securing it to PC card 12. Bends 20a and 20b are substantially ninety degrees which allows support legs 22a and 22b to be substantially parallel to the side of the battery 10. The side of the battery 10 is in contact with support legs 22a and 22b such that there is a mechanical and electrical connection made between support legs 22a and 22b and the side of battery 10. In the preferred embodiment, bends 24a and 24b are approximately 82 degrees which cause downward (compressive pressure) arms 26a and 26b to angle downward toward the top of the battery 10. Downward arms 26a and 26b angle down to the top surface of the battery 10 until they contact the top surface of the battery 10 at bends 28a and 28b. Bends 28a and 28b are approximately 156 degrees and cause upward (compressive pressure) arms 30a and 30b to angle upward and away from the top surface of battery 10. Bends 32a and 32b are approximately 82 degrees with respect to the side of the battery 10, however, they also angle towards each other and converge at bend 36 which is approximately 20 degrees. Flange sections 34a and 34b are in contact with the side of the battery 10 and provide electrical and mechanical connection between spring battery retainer 44 and the battery 10.

Turning now to FIGS. 3 and 4, FIG. 3 shows a side view of the PC card 12, spring battery retainer 44 and the battery 10 and FIG. 4 shows a top view of the spring battery retainer 44 and the battery 10. As shown in FIG. 3, the lead 14a (14b is not shown) extends through the PC card 12. Base section 18a is parallel with and flush to the PC card pad 38a. Bends 16a and 20a are substantially ninety degrees which allows the support leg 22a to contact the side of the battery 10. Bend 24a is shown as approximately 82 degrees and allows downward arm 26a to angle toward a center line of the battery 10. This allows contact between the battery 10 and the spring battery retainer 44 at the bend 28a. Bend 28a allows the upward arm 30a to angle away from the top of the battery 10 to the bend 32a as previously described in the discussion of FIG. 2.

When battery 10 is removed from the between the PC card 12 and the spring battery retainer 44, the angles formed by the bends 24a and 24b (not shown) will decrease causing the distance 52 to decrease by approximately 0.062 inches. When the battery 10 is inserted underneath the spring battery retainer 44, a compressive force is exerted on the battery 10 at the bends 28a and 28b. This compressive force serves to "hold down" the battery 10 to the PC card 12. Between the battery 10 and the PC card 12 is a pad 40 (FIG. 2) which provides for an electrical connection between the cathode of the battery 10 and the PC card 12. The compressive force is necessary to insure reliable electrical contact between the cathode of the battery 10 and the pad 40. FIG. 4 shows the triangular nature of the lateral support of the battery 10 by showing a top view of the contact between the support legs 22a and 22b and the flanges 34a and 34b and the battery 10.

Thus, spring battery retainer 44 is inserted through the holes 46a and 46b into PC card 12 and then soldered along the base sections 18a and 18b to the pads 38a and 38b. Tip bend 36 is then lifted slightly and the battery 10 is inserted under spring battery retainer 44. Spring battery retainer 44 provides compressive pressure along a center line 50 of the battery 10 which provides reliable electrical and mechanical connection between the battery 10, and pad 40 and between the battery 10 and spring battery retainer 44. The triangular nature of the spring battery retainer 44 also prevents lateral movement of the battery 10.

If the size of the button battery 10 does not exceed ½ inch and the button battery 10 will not require frequent replacement, then the spring battery retainer 44 can be fabricated from phosphor bronze with temper specification QQW-321d. If the size of the button battery exceeds ½ inch in diameter or the battery may require regular replacement, then spring battery retainer 44 is fabricated from beryllium copper, alloy No. 25, ¾ hard, with temperature specification QQC-530. It is then heated to 600 degrees Fahrenheit for one hour and plated. The beryllium copper spring battery retainer is less likely to deform if mishandled and will produce a hold down force approximately 25 to 50 percent higher than is obtained by using phosphor bronze.

FIG. 5 shows a side view of the spring battery retainer 44 with the approximate angles for bends 16a, 16b, 20a, 20b, 24a, 24b, 28a, 28b, 32a and 32b.

While the preferred embodiments of the present invention have been described and illustrated, various modifications will be apparent to those skilled in the art and it is intended to include all such modifications and variations within the scope of the appended claims.

What is claimed is:

1. A battery retainer comprising
   contact section means adapted to contact a button shaped battery, having oppositely facing sides and a circular circumference region joining said sides, at a plurality of points along said circumference region of said battery, at least three of said points forming a triangle, and
   said contact section means includes compressive pressure means which in conjunction with base support means of said battery retainer is adapted to apply hold-down pressure on a first side of said battery and to secure said battery to an electrical circuit means with the second side of said battery being pressed against said circuit means, said base support means being adapted to space apart said contact section means to enable said battery retainer to be secured to an electrical circuit means.

2. A battery retainer as in claim 1 wherein
   said battery retainer is a length of wire made of a tempered metal alloy.

3. A battery retainer as in claim 1 wherein
   said electrical circuit means is a printed circuit card.

4. A battery retainer comprising a pair of support legs adapted to contact a button shaped battery, having oppositely facing sides and a circular circumference region joining said sides, at plural points along said circumference region of said battery, said support legs having based means adapted to space apart said support legs and enable said retainer to be secured to an electrical circuit means, flange means adapted to contact the button battery at another point along the circumference region of the battery, said another point forming a triangle with said points of said support leg means, and compressive pressure arm means connected between said support leg means and said flange means and adapted to apply hold-down pressure on a first side of said battery for holding a second side of said battery to said electrical circuit means by being pressed against said circuit means.

5. A length of wire formed in the shape of a button shaped battery retainer comprising a first bend that forms said wire in substantially a "V" shape, a second and third bend each of approximately 82 degrees that form the lower portion of said "V" shape into two flange sections that are joined at the apex of said "V" shape and said second and third bends also form two upward arms wherein the intersection of the plane of said two upward arms with the plane of said two flange sections forms an acute angle with respect to the apex of the "V" shape, a fourth and fifth bend each of approximately 156 degrees that form two downward arms wherein the intersection of the plane of said two upward arms with the plane of said two downward arms forms an obtuse angle of approximately 156 degrees and wherein said fourth and fifth bends form a second and third apex at the junctions of said two upward arms and said two downward arms, a sixth and seventh bend each of approximately 82 degrees forming two support legs wherein the plane of said two support legs is substantially parallel to the plane of said two flange sections, an eighth and ninth bend each of approximately 90 degrees forming two base sections wherein the plane of said two base sections is substantially perpendicular to the plane of said two support legs, and a tenth and eleventh bend each of approximately 90 degrees that form two leads wherein the plane of said two leads is substantially perpendicular to the plane of said two base sections.

6. A battery retainer comprising a length of metal wire formed in a shape adapted to contact a first side of a button battery, having oppositely facing sides and a circular circumference region joining said sides, at plural points forming a triangle on the circumference region of said battery and adapted to contact and interconnect the battery to an electrical circuit means at and below a point in the palne of a second side of said battery.

7. A battery retainer as in claim 6 wherein said length of metal wire is adapted to apply hold-down pressure on said first side of said battery causing a second side of said battery to be pressed against said circuit means.

8. A battery retainer for a button shaped battery having a first side and an oppositely facing second side and a circular circumference region joining said sides comprising a single length of metal wire formed in a shape adapted to apply substantially symmetrical hold-down pressure on said first side of said button battery by contacting said first side of said button battery and adapted to supply lateral support by contacting plural points forming a triangle on the circumference region of said button battery, and said wire being adapted to contact and interconnect the battery to an electrical circuit means at and below a point in the plane of the second side of said button battery.

* * * * *